(12) United States Patent
Elian et al.

(10) Patent No.: US 10,107,867 B2
(45) Date of Patent: Oct. 23, 2018

(54) SENSOR ARRANGEMENT, BATTERY CELL AND ENERGY SYSTEM

(71) Applicant: Infineon Technologies AG, Neubiberg (DE)

(72) Inventors: Klaus Elian, Alteglofsheim (DE); Jochen Dangelmaier, Beratzhausen (DE); Franz Michael Darrer, Graz (AT); Thomas Mueller, Lappersdorf (DE); Mathias Vaupel, Regensburg (DE); Manfred Fries, Hunderdorf (DE); Guenther Ruhl, Regensburg (DE); Horst Theuss, Wenzenbach (DE); Matthias Rose, Kirchseeon (DE); Stephan Auer, Dachau (DE); Tue Fatt David Wee, Singapore (SG); Sie Boo Chiang, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 724 days.

(21) Appl. No.: 14/631,443

(22) Filed: Feb. 25, 2015

(65) Prior Publication Data

US 2015/0226810 A1   Aug. 13, 2015

Related U.S. Application Data

(63) Continuation-in-part of application No. 14/077,362, filed on Nov. 12, 2013, now abandoned.

(51) Int. Cl.
*H01M 10/48* (2006.01)
*G01R 31/36* (2006.01)
(Continued)

(52) U.S. Cl.
CPC .... *G01R 31/3658* (2013.01); *H01M 10/4257* (2013.01); *H01M 10/48* (2013.01);
(Continued)

(58) Field of Classification Search
CPC ............... H04Q 9/00; H04Q 2209/40; H04Q 2209/823; G01R 31/3658; H01M 10/48;
(Continued)

(56) References Cited

U.S. PATENT DOCUMENTS 8,434,940 B2   5/2013   Lachenmeier et al.
2005/0255381 A1*  11/2005  Shen ................... H01M 2/1094
                                        429/185
(Continued)

FOREIGN PATENT DOCUMENTS

DE   10200857710   5/2010
DE   102010007076   8/2011
(Continued)

OTHER PUBLICATIONS

Infineon Technologies, SP37 450kPa, Tire Pressure Sensor, www.infineon.com/sensors, 2 pgs., Jun. 2012.
(Continued)

*Primary Examiner* — Gary D Harris
(74) *Attorney, Agent, or Firm* — Schiff Hardin LLP

(57) ABSTRACT

A sensor arrangement according to an embodiment includes a substrate, and at least one sensor and a control circuit mounted on the substrate, wherein the at least one sensor and the control circuit are located on the substrate to be mountable inside a battery cell and outside the battery cell, respectively.

18 Claims, 13 Drawing Sheets

(51) Int. Cl.
*H01M 10/42* (2006.01)
*H04Q 9/00* (2006.01)
*H01M 10/0525* (2010.01)

(52) U.S. Cl.
CPC .......... *H04Q 9/00* (2013.01); *H01M 10/0525* (2013.01); *H01M 10/486* (2013.01); *H01M 2010/4271* (2013.01); *H04Q 2209/40* (2013.01); *H04Q 2209/823* (2013.01)

(58) Field of Classification Search
CPC ......... H01M 10/4257; H01M 10/0525; H01M 10/486; H01M 2010/4271
USPC .......................................................... 429/90
See application file for complete search history.

(56) References Cited

U.S. PATENT DOCUMENTS

| | | | | |
|---|---|---|---|---|
| 2009/0140870 | A1* | 6/2009 | Densham | H01M 10/4257 340/636.15 |
| 2010/0124250 | A1 | 5/2010 | Lachenmeier et al. | |
| 2013/0004811 | A1 | 1/2013 | Banerjee et al. | |
| 2013/0056703 | A1 | 3/2013 | Elian et al. | |
| 2013/0093383 | A1 | 4/2013 | Kim et al. | |
| 2013/0236755 | A1 | 9/2013 | Goldberg et al. | |
| 2014/0092375 | A1 | 4/2014 | Raghavan et al. | |
| 2014/0170446 | A1 | 6/2014 | Elian et al. | |
| 2014/0342203 | A1 | 11/2014 | Elian | |
| 2015/0004451 | A1 | 1/2015 | Elian et al. | |
| 2015/0311571 | A1* | 10/2015 | Krauss | H01M 10/0431 429/61 |

FOREIGN PATENT DOCUMENTS

| | | |
|---|---|---|
| DE | 10200046307 | 3/2012 |
| DE | 102013106740 | 12/2014 |
| EP | 2187472 | 5/2010 |
| EP | 2425485 | 3/2012 |
| EP | 2260524 | 12/2012 |
| EP | 2553747 | 2/2013 |
| EP | 2600443 | 6/2013 |
| JP | 2002313431 | 10/2002 |
| WO | WO 2009120294 | 10/2009 |
| WO | WO 2010126589 | 11/2010 |
| WO | WO 2011123808 | 10/2011 |
| WO | WO 2012041278 | 4/2012 |
| WO | WO 2013047994 | 4/2013 |
| WO | WO 2014095228 A2 * | 6/2014 ........ H01M 10/0431 |

OTHER PUBLICATIONS

Infineon Technologies, SP37 1300kPa, Tire Pressure Sensor, www.infineon.com/sensors, 2 pgs., Jun. 2012.
Infineon Technologies, "Sensor Solutions for Automotive and Industrial Applications", www.infineon.com/sensors, 40 pgs., Oct. 2012.
Wikipedia, "Reifendruckkontrollsystem", 4 pgs., Oct. 22, 2013 (w/English Translation).

* cited by examiner

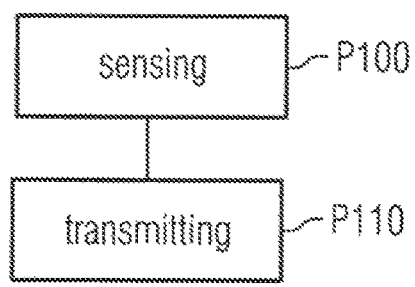
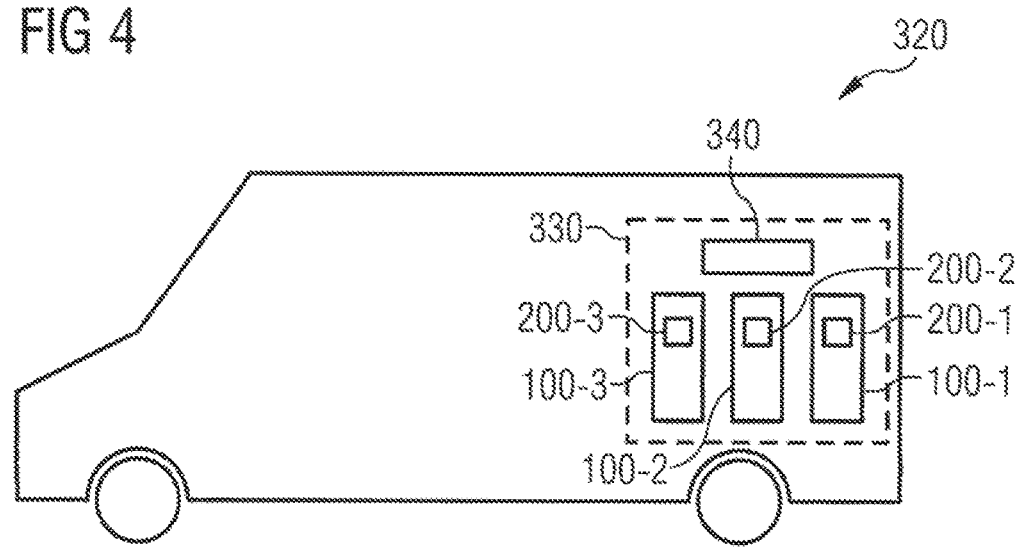

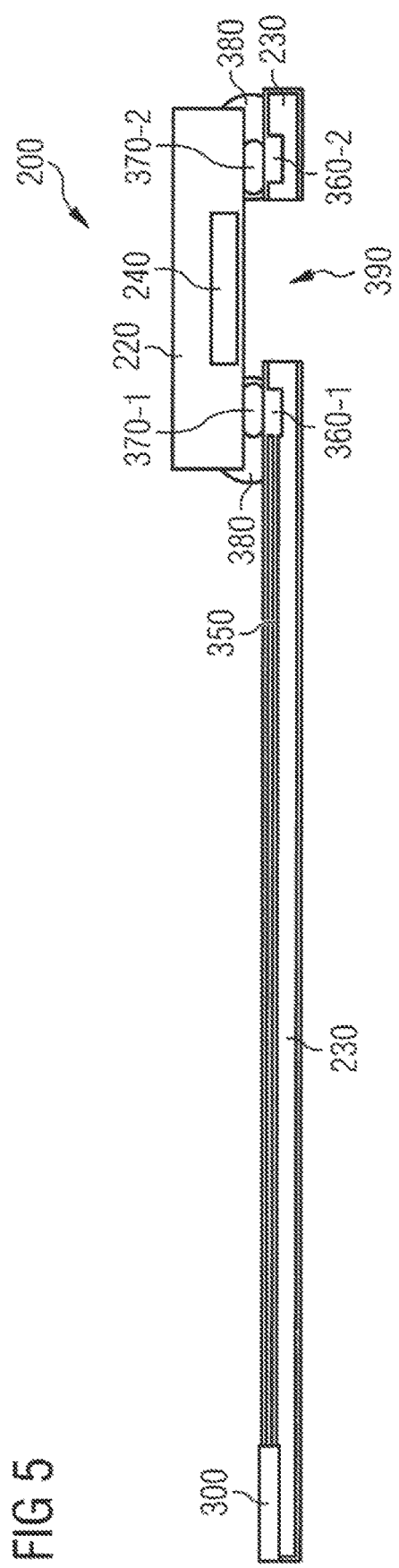

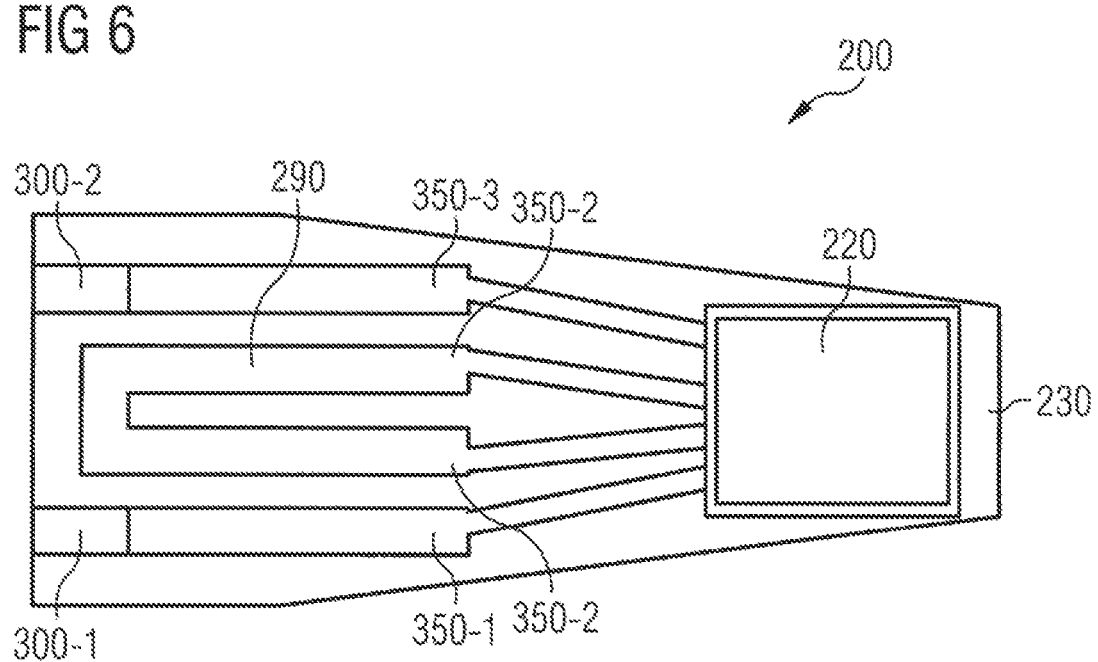

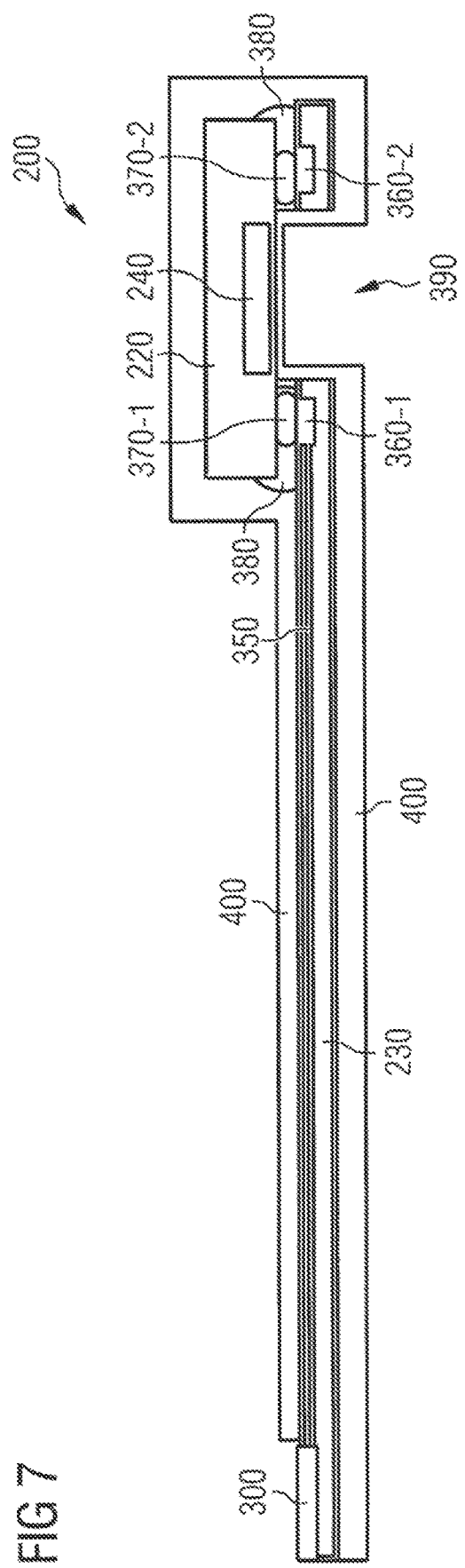

SENSOR ARRANGEMENT, BATTERY CELL AND ENERGY SYSTEM

CROSS-REFERENCE TO RELATED APPLICATIONS

This application is a Continuation-in-Part Application of application Ser. No. 14/077,362, filed Nov. 12, 2013, which is hereby incorporated by reference in its entirety.

FIELD

Embodiments relates to a sensor arrangement, an energy system and a method.

BACKGROUND

Battery cells are used today in a wide variety of applications. Possible applications comprise, for instance, mobile applications such as portable computers, phones and other electronic devices. Other applications comprise automotive applications, for instance, in the framework of electric or hybrid cars.

In many of these applications high performance battery cells are employed. In these but also other battery cells it may be advisable to monitor one or more operational parameters of the respective battery cells in order to evaluate their performance, their state or other safety-critical conditions. For instance, when operating a battery cell outside its safety specifications, the battery cell may endanger a device comprising the battery cell or even the safety of a person or of an animal.

However, in applications comprising a plurality of individual batteries, battery cells or similar units the effort to read-out the respective data concerning the individual batteries, battery cells or units may become substantial. However, by taking one or more operational parameters into account, a lifespan of a battery cell, of a battery, an energy system or a similar unit may be improved. Moreover, fabrication- and/or implementation-related parameters may play an important role.

Therefore, a demand exists to improve a trade-off between simplifying monitoring a battery cell, its safety, its lifespan, its fabrication, and its implementation.

SUMMARY

A sensor arrangement according to an embodiment comprises a substrate, and at least one sensor and a control circuit mounted on the substrate, wherein the at least one sensor and the control circuit are located on the substrate to be mountable inside a battery cell and outside the battery cell, respectively.

A battery cell according to an embodiment comprises a housing, and a sensor arrangement. The sensor arrangement comprises a substrate, at least one sensor and a control circuit, wherein the at least one sensor and the control circuit are mounted on the substrate such that the at least one sensor is located inside the battery cell and such that the control circuit is located outside the battery cell.

An energy system according to an embodiment comprises a plurality of battery cells, each battery cell comprising a housing, and a sensor arrangement. The sensor arrangements each comprise a substrate, at least one sensor and a control circuit, wherein the at least one sensor element and the control circuit are mounted on the substrate such that the at least one sensor is located inside the battery cell and such that the control circuit is located outside the battery cell.

BRIEF DESCRIPTION OF THE DRAWINGS

Several embodiments will be described below with reference to the enclosed figures.

FIG. 3 shows a flowchart of a method according to an embodiment;

FIG. 4 shows a vehicle according to an embodiment comprising an energy system according to an embodiment;

FIG. 5 shows a cross-sectional view of a sensor arrangement according to an embodiment;

FIG. 6 shows a plan view of the sensor arrangement of FIG. 5;

FIG. 7 shows a further sensor arrangement according to an embodiment;

DETAILED DESCRIPTION

In the following, embodiments according to the present invention will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

Battery cells are used today in a wide variety of applications comprising, for instance, high performance battery cells for electro-mobile applications such as electric or hybrid vehicles. Depending on the battery technology involved, critical conditions in high performance battery cells may lead to severe consequences. For instance, inside a high performance battery or battery cell a gas overpressure may develop, which in turn may lead to a destruction of the battery cell, fire or even an explosion of the battery cell. Today sensors are used to monitor these critical conditions in high performance battery cells.

When operating a battery cell outside its safety specifications, a battery cell may cause severe dangers to a device comprising the battery or the battery cells or to a human being or to an animal. For instance, non-controlled overcharge of a lithium-ion ($Li^+$) battery cell may lead to a generation of gas inside the battery cell. It may also cause burns due to overheating.

However, also in other battery types or battery cell types than high performance batteries or battery cells, respectively, similar challenges may be present.

As will be outlined in more detail below, a battery cell may comprise the necessary components to generate electrical energy based on electro-chemical reactions. A battery may comprise one or more battery cells. In case a battery comprises more than one battery cell, the individual cells may be coupled in series, in parallel or both. In case a battery comprises exactly one battery cell, the battery and the single battery cell comprised in it may be identical, but may be also different. For instance, the battery may comprise additional components such as an additional housing, mounting structures or the like.

Figure 1:
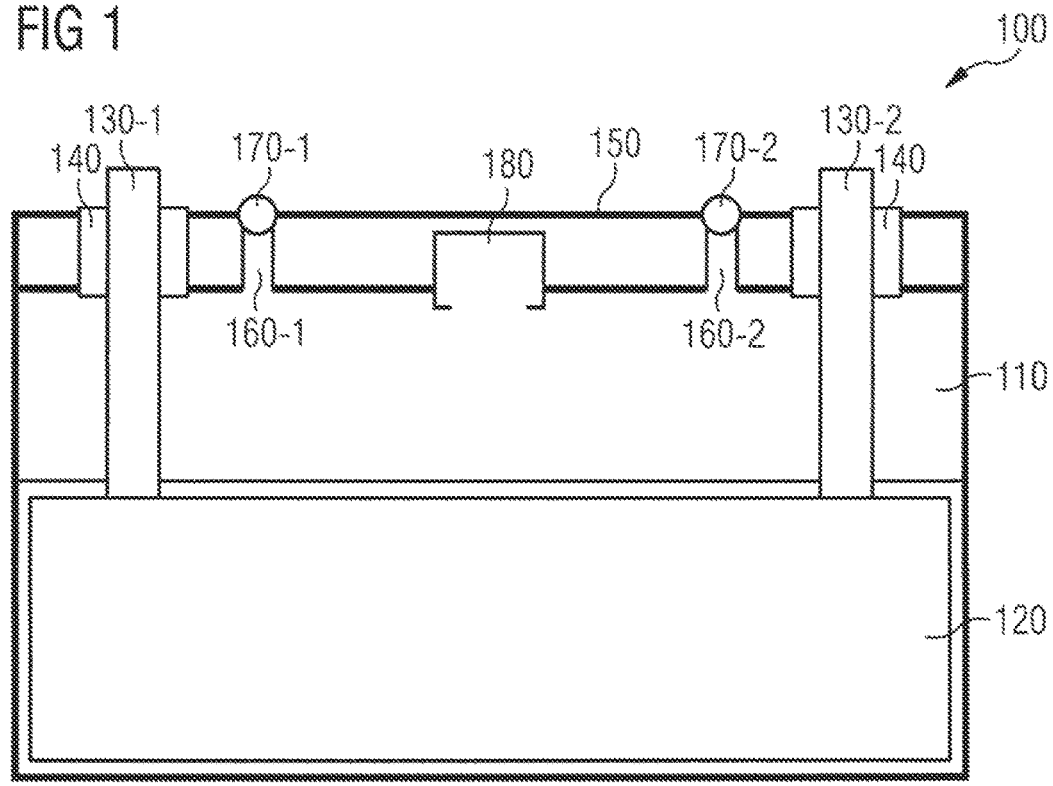
FIG. 1 shows a simplified cross-sectional view of a battery cell.

FIG. 1 shows a simplified cross-sectional view of a battery cell 100, which may, for instance, be implemented as a lithium-ion battery cell ($Li^+$). Such a battery cell may, for instance, be employed for an electro-mobility application.

The battery cell 100 comprises a housing 110, inside which a wound stack 120 may comprise, for instance, an electrode material, an active material, a separator, a further active material and a further electrode material. The stack 120 may comprise or be soaked in an electrolyte or an electrolyte solution. The electrolyte may, for instance, comprise lithium hexafluorophosphate ($LiPF_6$), which may be dissolved in a (polar) aprotic solvent comprising, for instance, dimethyl carbonate and/or ethylene carbonate. The housing 110 may, for instance, be fabricated from aluminum (Al).

The battery cell 100 further comprises a first electrode 130-1 and a second electrode 130-2, which may be electrically insulated by an insulator 140 from a cover 150 of the housing 110. The electrodes 130 may be coupled to the electrode material of the stack 120. The insulations 140 may further serve as a sealing gasket to prevent the electrolyte, the electrolyte solution and/or other chemical elements and compounds from leaving the battery cell 100. The insulations 140, working as sealing gaskets, may further prevent substances from entering the battery cell 100 or the housing 110 from outside. For instance, in the case of a lithium-based battery cell, it might be very advisable to prevent humidity and/or oxygen from entering the battery cell to avoid a severe exothermal reaction with the lithium comprised in the housing 110, which in turn may damage or even destroy the battery cell 100 and which may further risk damage to other components of a system or to human beings.

A battery cell 100 as the one depicted in FIG. 1 is typically manufactured by providing the stack 120 into the housing 110 with the electrodes 130 being electrically coupled to the respective electrode materials of the stack 120. Then the electrolyte or electrolyte solution may be filled into the housing 110 of the battery cell through one or more openings 160-1, 160-2, which may be closed by the appropriate number of bore closures 170-1, 170-2.

As a precaution measure against high pressures inside the housing 110 of the battery cell 100, the cover 150 may also comprise a blow-out disc 180, which may be destroyed once a critical pressure level is reached inside the housing 110 of the battery cell 100.

The electrodes 130 may in principle be formed from any suitable material. For instance, the first electrode 130-1 may be a copper electrode (Cu) and the second electrode 130-2 may be an aluminum electrode (Al). Naturally, the electrodes 130 may comprise a shape, for instance, outside the housing 110 to enable an easier coupling of the battery cell to an energy system or the like. For instance, the electrodes 130 may comprise a thread or even additional covers made from different materials, such as high quality steel or the like.

However, it should be noted that embodiments are by far not limited to specific design details of such a battery cell as the battery cell shown in FIG. 1. For instance, other forms of battery cells include a battery cell 100 based on pouch cells, which are also referred to as soft case battery cells, or solid cells, which may be combined within a larger module package. Moreover, design details are by far not limited to the design shown in FIG. 1. For instance, the number of individual elements, such as the openings 160, the blow-out disc 180, the number of electrodes and other parameters, may vary. Also in terms of the materials and chemical compounds mentioned above, a battery cell used in context with an embodiment may differ.

As the previous discussion as shown, in today's battery cells chemical media may be used, which may vaporize, when a temperature inside the battery cell 110 rises, for instance, due to local defects inside the electrode stack 120. This may result in an overload or a similar situation. Due to such an overload, a fail function, a shortcut or another similar situation in, for instance, a lithium polymer battery cell a gas may be formed, which may generate a strong internal pressure. Depending on the chemistry involved, the gas may, for instance, comprise hydrogen fluoride (HF). As a consequence, the battery cells may swell and even burst. Due to the oxygen entering the battery cell in such a case, the organic electrolytes may catch fire and the battery cell may burn.

To develop a safety battery cell technology for application such as electro-mobility, customers of these battery cells wish to detect a gas generation in a very early state, for instance, with the help of pressure sensors or gas sensors to enable a switching-off of the respective battery cell at a very early state.

The condition of the battery cell 100 may, for instance, be sensed or monitored using temperature sensors being arranged on the outside of the housing 110. In case the battery cell 100 tends to overheat, an emergency shutdown may be initiated. However, due to the temperature sensor being arranged on the outside of the housing 110, it may happen that the corresponding fail function inside the battery cell will only be detected at a very late stage, which may be too late to react appropriately quickly by an emergency shutdown.

However, to prevent the battery cell 100 and its housing 110 from exploding, the blow-out disc 180 has a predetermined breaking point, which may be integrated into the housing 110 or its cover 150. In the case the pressure inside the battery cell rises too high, the blow-out disc 180 may irreversibly blow. This may prevent the explosion of the battery cell. However, due to oxygen entering the battery cell 100 the previously mentioned danger exists that the chemistry inside the housing 110 may lead to a self-ignition and, hence, to a delayed fire hazard. For instance, it might happen that the battery cell catches fire only days later in a repair shop or at a temporary storage facility for defective battery cells.

As will be laid out in more detail below, embodiments may help to prevent such critical conditions by being integrated into the battery cell 110. Such an embodiment may, for instance, comprise a sensor system and an integrated wireless data transmission system. To be a little more specific, some embodiments may comprise the necessary sensor systems being directly integrated into the battery cell, which may enable a very quick and very close measurement of critical operational parameters. To allow an easier access of the data, the sensed operational parameters may be transmitted wirelessly, for instance using a radio-based transmission instead of a conventional cable-bound or wire-bound solution. This may enable to reduce the complexity of an energy system by essentially avoiding the wiring harness for the signal lines to electrically couple the sensors of each of the battery cells to a battery management system or a similar control unit. Assuming, for instance, an energy system comprising a large number of battery cells, each of the battery cells needs to be electrically coupled by a signal line to enable the battery management system to read out the sensors of the battery cells. In some applications, the number of battery cells 100 may be several 10 or even exceeding 100 battery cells.

Figure 2:
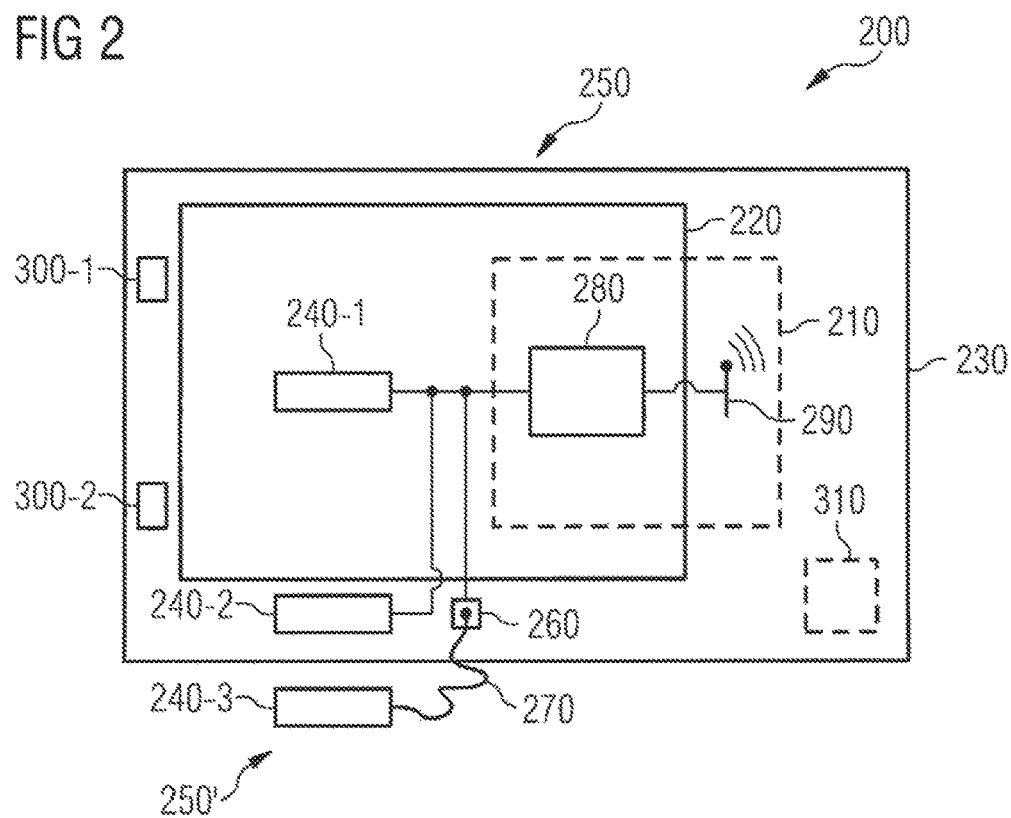
FIG. 2 shows a block diagram of a sensor arrangement according to an embodiment.

FIG. 2 shows a block diagram of a sensor arrangement 200 comprising a transmitter 210 to be arranged inside a battery cell 100 and to transmit a signal based on at least one sensed operational parameter of the battery cell wirelessly. As outlined before, the transmitter 210 may be configured to transmit the signal by a radio-based transmission.

To increase the safety of operation of such a battery cell, the at least one operational parameter of the battery cell may be indicative of a safety-critical condition of the battery cell 100. For instance, the at least one operational parameter of the battery cell 100 may be any parameter of a group of parameters, which comprises, for instance, a temperature of the battery cell 100, a temperature of an electrolyte or an electrolyte solution, a pressure inside the battery cell 100, a concentration of a chemical element or a chemical compound inside the battery cell, a mechanical stress of the housing 110 of the battery cell 100, a mechanical stress of another component of the battery cell 100, a current value of a current flowing at least one of inside, out of and into the battery cell 100, a potential of an electrode of the battery cell 100 and a voltage of the battery cell 100. Depending on the battery cell technology involved, any of these operational parameters may be indicative of a safety-critical condition, when, for instance, the respective operational parameter fulfills a predefined condition. For instance, depending on the operational parameter, when the respective parameter becomes larger or smaller than a threshold value, this may be indicative of such a safety-critical condition of the battery or battery cell being reached.

The sensor arrangement 200 may comprise a semiconductor die 220, which may comprise at least a part of a circuitry of the sensor arrangement 200. The die 220 may be mounted and electrically coupled to a substrate 230, which may, for instance, be a printed circuit board (PCB) or a similar substrate 230 for the semiconductor die 220. For instance, the substrate 230 may be flexible.

As will be laid out in more detail in the context of FIGS. 5, 6 and 7, the die 220 may be mounted to the substrate 230 using a flip-chip-technique. In this case, a chemically inert underfill material with respect to an electrolyte or an electrolyte solution of the battery cell 100 may be arranged between the die 220 and the substrate 230. This may, for instance, enable a compact and yet chemically stable mounting of the die to the substrate 230, which may be favorable in terms of a fabrication effort of the sensor arrangement 200.

The die 220 may at least partially encapsulated by a mold compound, a resin and/or an epoxy resin. Moreover, the die 220 or a package comprising the die 220 may be at least partially covered by a chemically inert protective cover with respect to an electrolyte or an electrolyte solution of the battery cell. The protective cover may, for instance, comprise a carbon layer, peryline, polytetrafluorethylene (PTFE) or any combination thereof. This may further help to protect the sensor arrangement from adverse chemical effects brought onto the sensor arrangement 200, for instance, by the electrolyte or the electrolyte solution of the battery cell 100.

To sense the at least one operational parameter of the battery cell 100, the sensor arrangement 200 may further comprise at least one sensor 240. To be more precise, in the embodiments depicted schematically in FIG. 2, the sensor arrangement 200 comprises three sensors 240-1, 240-2, 240-3. The first sensor 240-1 is integrated onto or into the semiconductor die 220. In contrast, the second sensor 240-2 is implemented outside the semiconductor die 220, but on or as part of the substrate 230 forming along with the semiconductor die 220 a package 250. However, sensors may also be implemented independent of the package 250 comprising a semiconductor die 220 and a substrate 230. To illustrate this, the sensor arrangement 200 shown in FIG. 2 further comprises the third sensor 240-3, which is coupled to the transmitter 210 by a contact pad 260 and a measurement connection 270 such as a wire or cable. The third sensor 240-3 forms, accordingly, a further package 250' or a second package 250' with respect to the first package 250. The second package 250' may be independent of the first package 250 comprising the semiconductor die 220 in the embodiment shown in FIG. 2.

The transmitter 210 may comprise a transmission signal generator 280 and an antenna 290. With respect to the first and second sensors 240-1, 240-2, the transmission signal generator 280 is integrated into the same or single package 250. However, with respect to the third sensor 240-3, the transmission signal generator 280 is integrated into a first package 250, while the sensor 240-3 is integrated or part of a second package 250' different from the first package 250.

The transmission signal generator 280 may be capable of receiving the signals provided by the sensors 240 and to generate a signal which is capable of being transmitted via the antenna 290. However, the antenna 290 is by far not required to be implemented in the same package 250 or on the same die 220 as the transmission signal generator 280. However, in the embodiment shown in FIG. 2 the antenna 290 is implemented as a part of the package 250 also comprising the transmission signal generator 280. However, the antenna 290 is part of the substrate 230.

Hence, the transmission signal generator 280 may comprise a microcontroller, which is capable of reading or acquiring the data or signals provided by the sensors 240, to process the respective signals and to transform the signals, for instance, into radio frequency signals, which are then provided to the antenna 290 for transmission outside the battery cell 100 (not shown in FIG. 2). However, instead of a radio frequency antenna 290 also transmitter may be employed.

To supply the sensor arrangement 200 with energy, the sensor arrangement 200 may be configured to be coupled with at least one electrode 130 of the battery cell 100 to obtain electrical energy for operation from the battery cell 100. For instance, the substrate 230 may comprise one or more supply terminals 300-1, 300-2 to be coupled to the electrodes 130 of the battery cell 100 to supply the sensor arrangement 200 with the electric energy to operate. However, in other embodiments one of the supply terminals 300 may, for instance, be coupled to another reference potential such as a ground potential. Supplying the sensor arrangement 200 with the necessary energy to operate can, in other words be delegated to the battery cell 100 to be monitored by the sensor arrangement 200 itself.

The sensor arrangement 200 may also comprise a supply battery cell 310 to supply the sensor arrangement 200 with the necessary energy to operate. In FIG. 2 the optional supply battery cell 310 is shown to be implemented in the package 250 or, to be more precise, as part of or integrated into or onto the substrate 230. In other words, the battery cell 310 is here part of the package 250 or comprised in the package 250. However, the battery cell 310 may in principle also be comprised in the second package 250' comprising, for instance, a sensor 240 or in another package such as an individual package.

As outlined before, the sensor arrangement 200 may be designed to be operated inside a battery cell such as a lithium-ion battery cell. In this case, the battery cell may comprise at least one of an aprotic solvent and lithium hexafluorophosphate, to which the sensor arrangement 200 should show at least a sufficient resistivity such that at least an occasional contact between the sensor arrangement 200 and the battery cell chemicals do not cause an immediate failure of the sensor arrangement 200.

Naturally, as outlined before, the number of components used such as a number of sensors 240 or a number of supply terminals 300 may vary among other parameters and design features between embodiments. For instance, a sensor arrangement 200 may comprise any number of sensors 240. Naturally, also the number of supply terminals 300 may vary depending on the number of voltages needed to be externally supplied to the sensor arrangement 200. In the case that supply battery cell 310 is implemented, implementing any supply terminal 300 might not be necessary at all.

FIG. 3 shows a flowchart of a method according to an embodiment. The method comprises in an operation P100 sensing at least one operational parameter of a battery cell inside the battery cell. It further comprises in an operation P110 transmitting a signal based on the at least one sensed operational parameter of the battery cell from inside the battery cell wirelessly.

FIG. 4 shows a vehicle 320 according to an embodiment comprising an energy system 330 according to an embodiment. The energy system comprises a plurality of battery cells 100-1, . . . , 100-3, each battery cell 100 comprising a sensor arrangement 200-1, . . . , 200-3 as outlined before. The sensor arrangements 200 may be implemented identically or may differ at least partially from one another.

The energy system 330 further comprises a battery management system 340, which is arranged outside the plurality of battery cells 100 and configured to receive the signals from the sensor arrangements 200 of the plurality of battery cells 100. The battery management system 340 may, hence, comprise an antenna to receive the radio-based transmissions from the sensor arrangements 200. In case of a different wireless transmission scheme used by the sensor arrangements 200, the battery management system 340 may comprise a corresponding receiver. Naturally, the battery management system 340 may also comprise several receivers to allow different wireless transmission schemes to be used by the battery cells 100.

The battery management system 340 may be configured to provide a signal based on the signals received from the sensor arrangements 200 of the plurality of battery cells. The signal provided by the battery management system 340 may, for instance, be indicative of a malfunction, an overload or another situation of at least one of the battery cells 100 of the plurality of battery cells. For instance, the battery management system 340 may read the signals provided by the sensor arrangements 200 of the individual battery cells 100 to extract one or more operational parameter(s) from these signals. If one or more of these parameter(s) of one or more of the battery cells 100 fulfill a predetermined relationship, for instance being larger than or lower than a threshold value, the signal provided by the battery management system 340 may indicate a malfunction of the respective battery cell 100 or battery cells 100. Based on the signal provided, the battery cells 100, it may be possible to initiate a shutdown or another fail save mechanism, for instance, notifying the driver of the vehicle 320 of the malfunction.

Naturally, also the sensor arrangements 200 may be configured in such a way that they only transmit the signal indicative of the at least one operational parameter when a predetermined relationship is fulfilled in terms of the respective operational parameter. For instance, the signal transmitted by one of the sensor arrangements 200 may indicate only the respective battery cell. In this case the battery management system 340 may determine the presence of a malfunction and the corresponding battery cell 100 simply based on receiving the respective signal from the battery cell or battery cells 100 in question. However, the sensor arrangements 200 may further provide and transmit more data such as the operational parameter and/or its value fulfilling the predetermined relationship. Naturally, the sensor arrangements 200 may also transmit the signals intermittently, continuously or according to another pattern or on demand in response to demand signal by the battery management system 340.

The vehicle 320 may, for instance be any motorized vehicle such as a car, a truck, a locomotive, an agricultural machine or a construction machine to name but a few. Such a vehicle may operate on electric energy alone, such as an electric car, or electric energy may contribute to moving the vehicle, such as in a hybrid car.

FIG. 5 shows a schematic cross-section through a sensor arrangement 200 according to an embodiment comprising a pressure sensor for integration into a battery cell 100. The sensor arrangement 200 comprises a semiconductor die 220 comprising at least a transmission signal generator 280 (not shown in FIG. 5). The die 220 further comprises a pressure sensor 240 based on micro-electromechanical system's (MEMS) technology. The semiconductor die 220 is mounted onto a substrate 230 using the flip-chip-technique. The substrate 230 comprises circuit paths 350, which are at least partially buried inside the substrate 230 to prevent the material of the circuit paths 350 from being attacked by the previously mentioned chemicals of the battery cell 100 (not shown in FIG. 5).

In the cross-sectional view of FIG. 5 only one circuit path 350 is shown, which connects one of the supply terminals 300 with a contact pad 360-1, to which the semiconductor die 220 is mechanically and electrically coupled by a solder dot 370-1. The substrate 230 further comprises a second contact pad 360-2 in the cross-sectional view shown in FIG. 5. The semiconductor die 220 is coupled to the second contact pad 360-2 using a further solder dot 370-2. To electrically insulate and to mechanically stabilize the semiconductor die 220 on the substrate 230, a chemically inert underfill material 380 with respect to the chemicals used in the battery cell 100 may be deposited between the semiconductor die 220 and the substrate 230.

However, to allow the atmosphere inside the battery cell to interact with the sensor 240, both the substrate 230 and the underfill material 380 comprise an opening 390 through which the pressure inside the battery cell can interact with the sensor 240. The opening 390 may be arranged in such a way that the sensitive area of the semiconductor die 220 (sensor 240) is aligned with the opening 390 essentially without mechanical stress being applied from the substrate 230 onto the semiconductor die 220. The substrate 230 may be a flexible substrate. The circuit paths 350 may be, for instance, fabricated by printing the circuit paths 350 onto a layer of the substrate 230, which may be coated at least partially to protect the circuit paths 350 after the printing process.

FIG. 6 shows a plan view of the sensor arrangement 200 shown in FIG. 5. In the plan view of FIG. 6, the die 220 is shown from its backside with the chemically inert underfill material 380 essentially protruding from underneath the die 220 in all directions in a plane of the substrate 230.

The sensor arrangement 200 comprises three circuit paths 350-1, 350-2 and 350-3, of which the second circuit path 350-2 is shaped as a loop to form the antenna 290 of the transmitter 210 (not shown in FIGS. 5 and 6). The other two circuit paths 350-1, 350-3 are electrically coupled to the supply terminals 300-1, 300-2, respectively, by which the sensor arrangement 200 is capable of being supplied with electrical energy from the battery cell 100.

In other words, FIGS. 5 and 6 show a schematic cross-sectional view and a plan view of a sensor arrangement 200 being brought onto a flex print substrate 230 forming a flex print based pressure sensor package, which comprises a chemically stable underfill material. The sensor chip or sensor die 220 also comprising the transmission signal generator 280 comprises a MEMS-based sensor 240 to measure or sense the pressure inside the battery cell 100 (not shown in FIGS. 5 and 6). The sensor arrangement 200 shown here is implemented using the flip-chip-technique and the chemically stable underfill material to protect the chip inside the package as good as possible from chemical influences.

However, as FIG. 7 will show, optionally, the sensor arrangement 200 may further comprise an additional protective cover, which may cover the silicon die 220 and/or the substrate 230 completely or at least partially to increase a resistivity against chemical influences.

In the embodiment shown in FIG. 7, the sensor arrangement 200 is essentially completely covered by a protective cover layer 400 including the substrate 230 apart from the supply terminals 300, the semiconductor die 220 including the area underneath the opening 390 directly adjacent to the sensor 240. The protective cover 400 may be essentially formed from any chemically stable layer with respect to the chemicals used in the battery cell 100 (not shown in FIG. 7). Examples comprise peryline, plasma-deposited carbon layers and polytetrafluoroethylene (PTFE).

While in the embodiments shown in FIG. 7 the protective cover 400 is directly deposited onto the substrate 230 and the silicon die 220, the protective cover 400 may also be applied on top of an encapsulating material used to encapsulate the die 220 and/or the substrate 230. As an encapsulating material any mold compound, a resin or an epoxy resin may be used to name just a few examples. Naturally, also any combination may be used.

Figure 8:
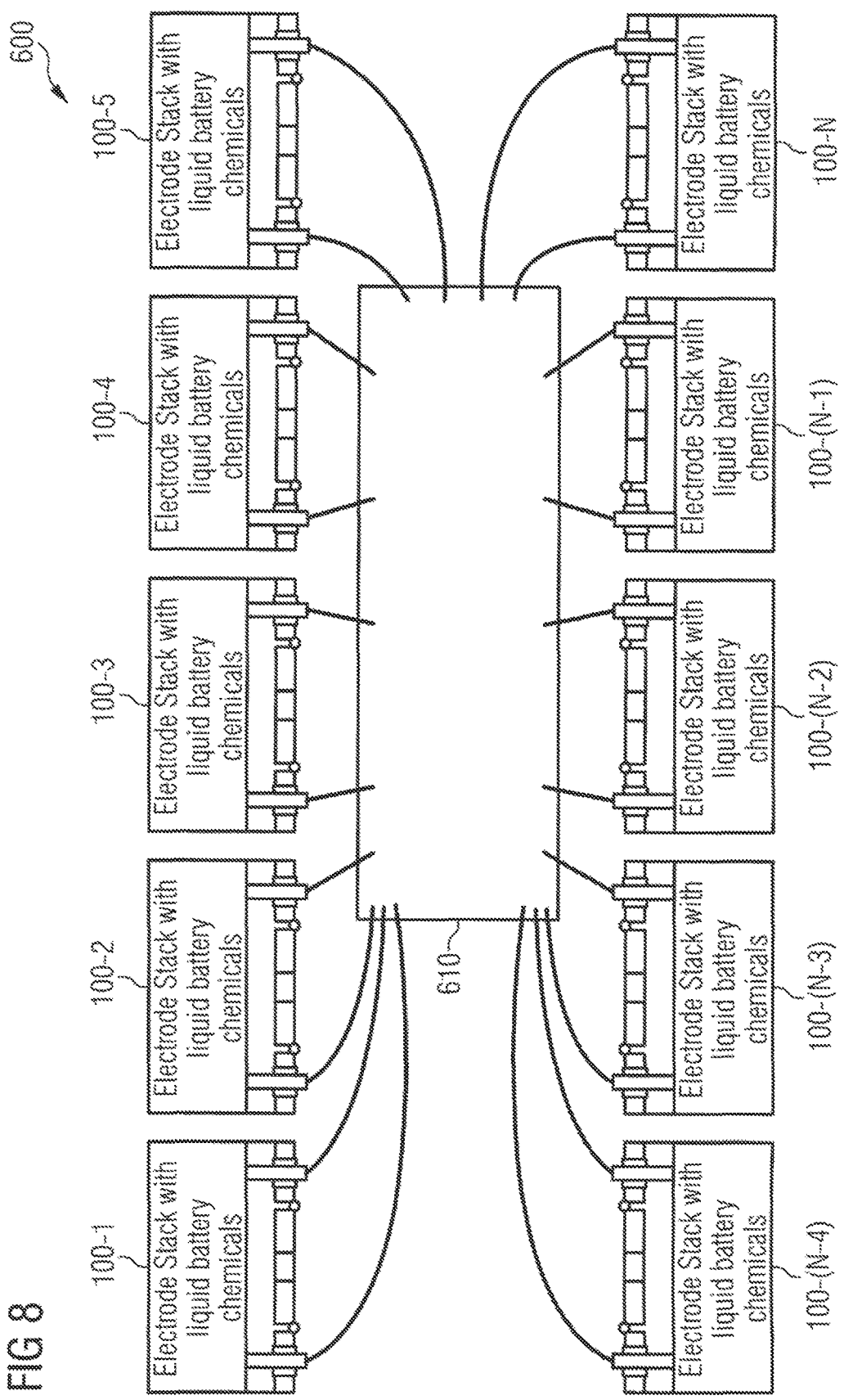
FIG. 8 shows a block diagram of a conventional energy system.

By using a battery cell with an integrated sensor and a radio frequency transmitter, it may be it is possible to reduce the cable harness significantly. To illustrate this, FIG. 8 shows a schematic block diagram of a conventional energy system 600. The energy system 600, which is also referred to as a (complete) battery cell module, typically comprises a significant number of battery cells 100-1, . . . , 100-N, which are coupled to a conventional battery management system 610, N being an integer larger than 1. Each of the N battery cells is coupled to the battery management system 610 by at least one wire to allow the battery cells 100 to be individually sensed and monitored. As a consequence, a lot of wires have to be used to link all the respective battery cell sensors to the battery management system 610. In yet other words, a very large and expensive cable tree for linking the battery cells 100 properly to the battery management system is needed. For instance, in case of a hybrid or electric car the number of battery cells can be more than several ten battery cells. For instance, for a electric car the number of battery cells comprised in an energy system 600 may be 100 or more.

Figure 9:
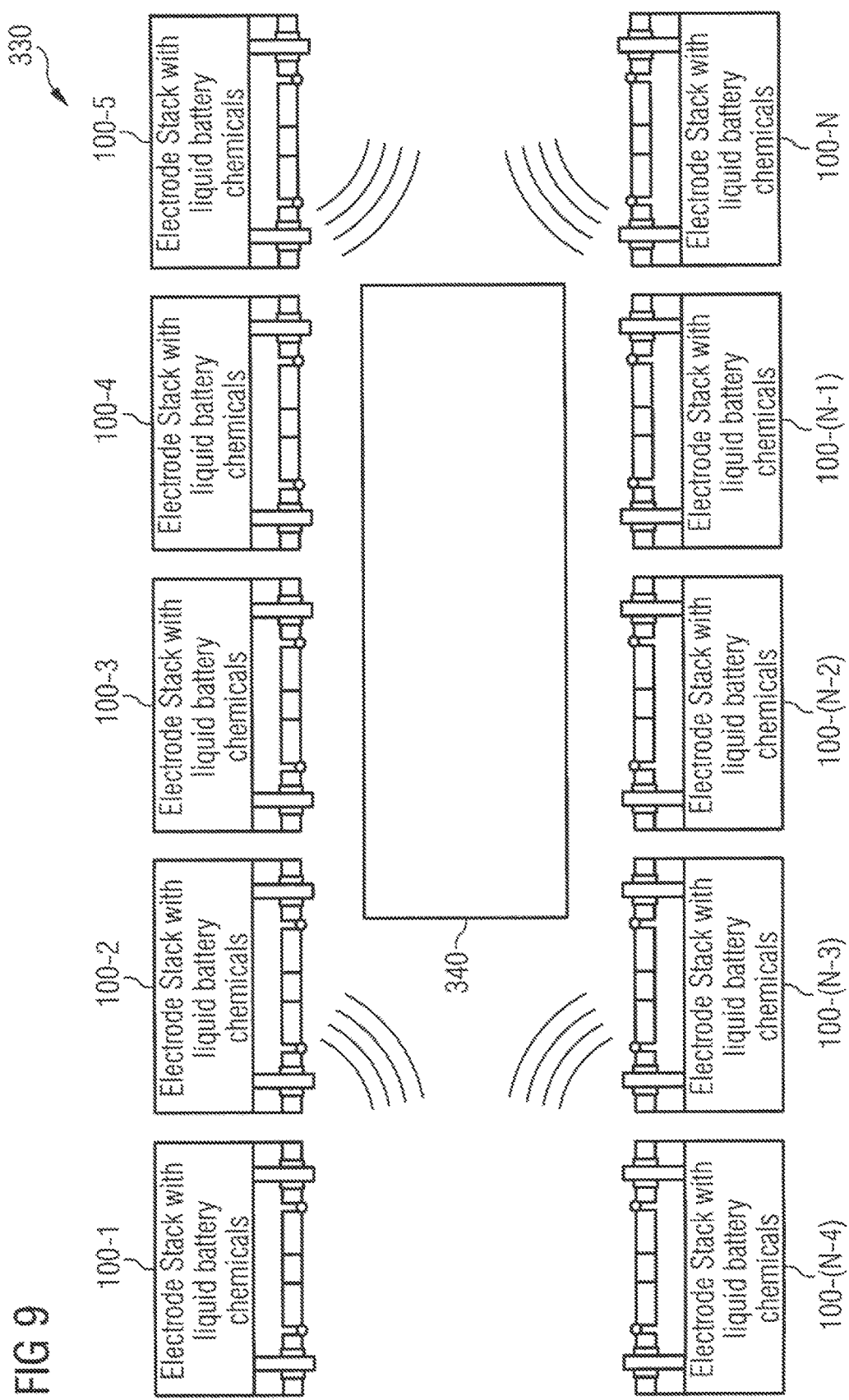
FIG. 9 shows a block diagram of an energy system according to an embodiment.

FIG. 9 shows a schematic view of an energy system 330 according to an embodiment comprising—similar to the conventional solution shown in FIG. 8—a number N of battery cells 100-1, . . . , 100-N, N being again an integer larger than 1 (N≥2). Each of the battery cells 100 comprises a sensor arrangement 200, which have been omitted in FIG. 9 for the sake of simplicity only. However, each of the sensor arrangements 200 not shown in FIG. 9 is comprised inside each of the battery cells 100, which allows the respective sensor arrangement 200 to communicate wirelessly with the battery management system 340, for instance, by radio.

By using a radio communication system or another wireless communication system the number of cables to be used inside the energy system 330 can be dramatically reduced, which may become significant in terms of larger energy systems 330 comprising many individual battery cells 100. In other words, each battery cell 100 comprises besides a sensor a transmitter inside the respective battery cell, which takes its power from the battery cell 100 itself or from an own supply battery cell 300 (not shown in FIG. 9). The information obtained by the sensor arrangement 200 are sent out of battery cells 100 towards a central battery management system 340 by a wireless communication scheme.

Figure 10:
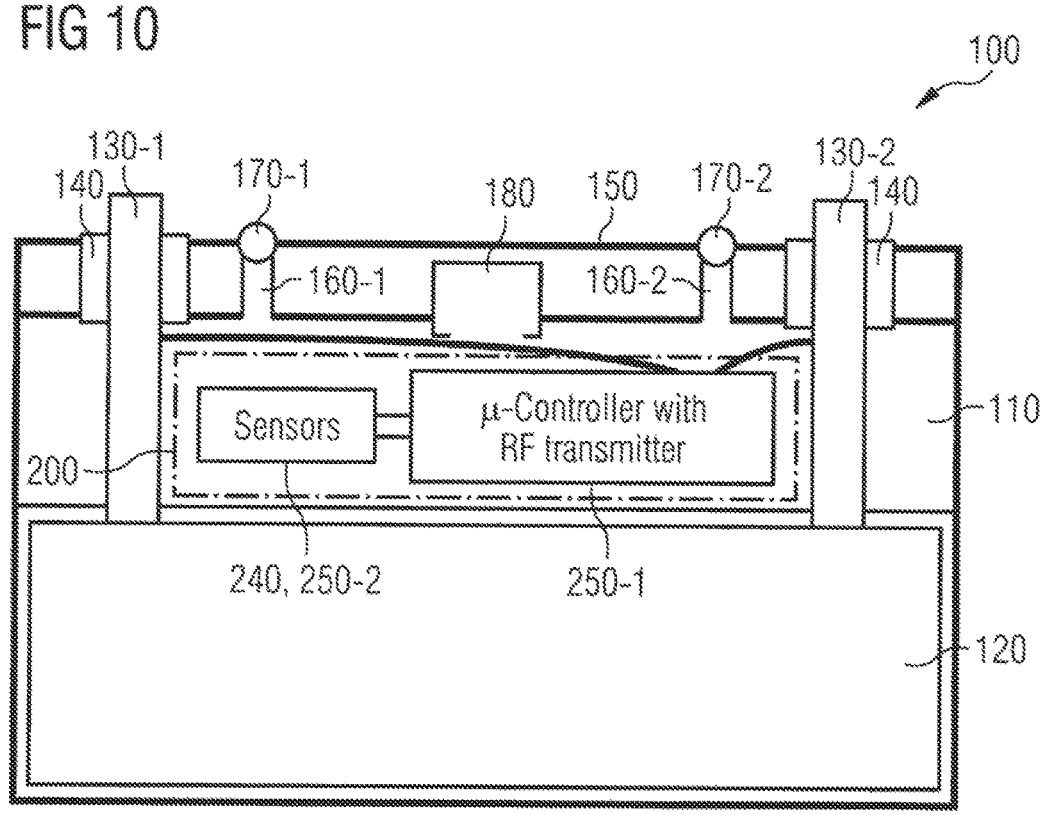
FIG. 10 shows a simplified cross-sectional view of a battery cell comprising a sensor arrangement according to an embodiment.

FIG. 10 shows a schematic cross-section view of a battery cell 100 comprising a sensor arrangement 200. Due to the sensor arrangement 200, the battery cell 100 comprises an integrated sensor and a wireless transmitter. The battery cell 100 itself is essentially identical to the one shown in FIG. 1. Therefore, reference is made to FIG. 1 in terms of the description of the battery cell 100.

However, the battery cell 100 further comprises the sensor arrangement 200 as mentioned before. The sensor arrangement 200 comprises in a first package 250-1 a microcontroller with a RF transmitter (RF=radio frequency), which is arranged inside the gas filled space inside the battery cell 100. The gas filled space is arranged above the stack 120 of electrodes and the cover 150 of the housing 110 of the battery cell 100. However, it is to be noted that the gas filled space in FIG. 10 is not drawn to scale. To be more precise, in implementations the space may be drawn larger in FIG. 10 than the actual space in an implementation. However, in principle also a larger gas space may be implemented.

The first package 250-1 comprised in the microcontroller (μ-controller; μC; uC) and the RF transmitter are coupled to the electrodes 130-1, 130-2 of the battery cell 100 by cables to supply the sensor arrangement 200 with the necessary energy to operate. The cables for the power connection are arranged inside the battery cell. However, in other embodiments by implementing a supply battery cell 310 (not shown in FIG. 10) can eventually be omitted.

In a second package 250-2 a sensor 240 is arranged which is coupled to the first package 250-1 to allow the at least one operational parameter to be sensed by the sensor arrangement 200. The sensor 240 may, for instance, comprise a temperature sensor, a chemistry sensor, a gas pressure sensor, a stress sensor, a current sensor, an optical sensor or another sensor sensed to a physical or chemical property.

Figure 11:
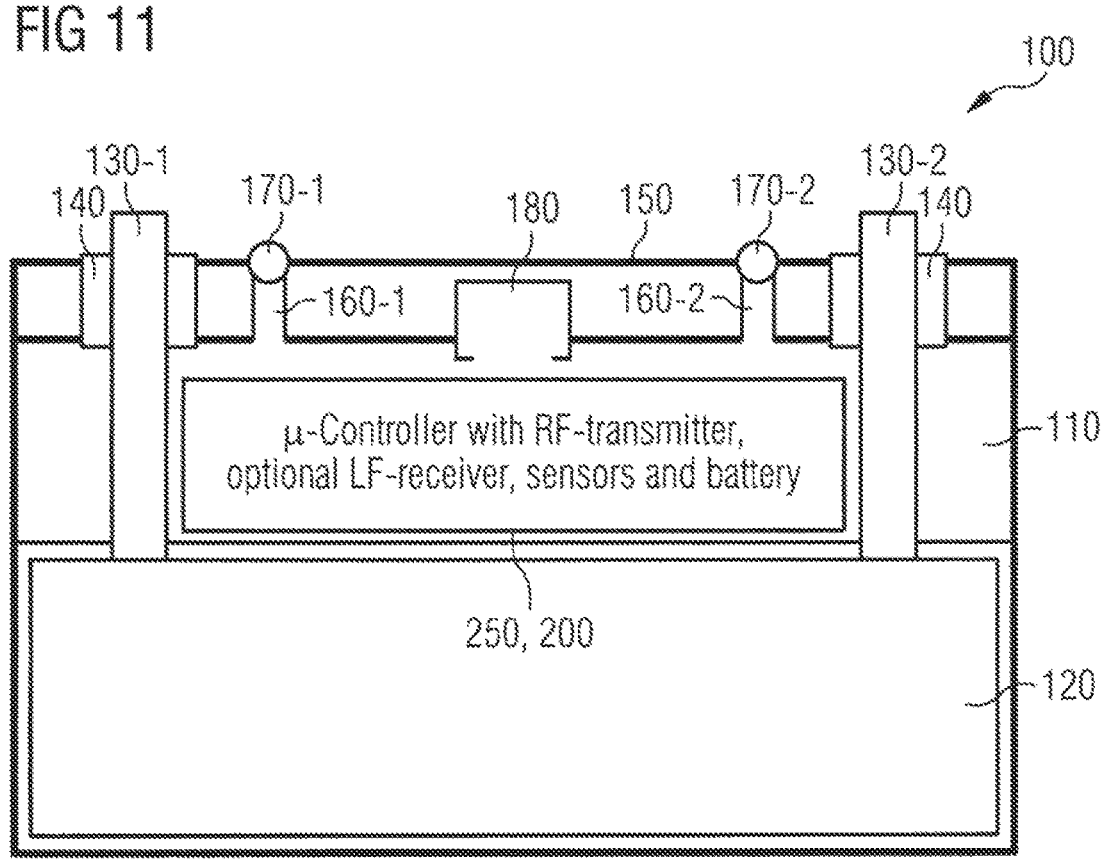
FIG. 11 shows a simplified cross-sectional view of a battery cell comprising a further sensor arrangement according to an embodiment.

FIG. 11 shows a schematic cross-sectional view of a further battery cell 100 comprising a sensor arrangement 200. In the embodiment shown in FIG. 11, the sensor arrangement 200 is implemented as a single package 250 comprising a microcontroller with the radio frequency transmitter, an optional low frequency receiver (LF receiver) along with at least one sensor and a supply battery cell to provide the sensor arrangement 200 with a necessary energy to operate. The sensor arrangement 200 may comprise several sensors 240, which may, for instance, be sensitive to a pressure in the gas space above the electrolyte and the electrode stack 220, the temperature of the gas or rather the chip and other operating parameters. In contrast to the previously described embodiments, the sensor arrangement 200 also comprises a receiver, which can be used to perform the measurements on a request triggered by a corresponding signal. For instance, the receiver may be a low frequency receiver of, for instance, approximately 125 kHz or another corresponding frequency. Other wireless communication techniques may be used to communicate with the sensor arrangement 200 to provide commands and instructions to the arrangement 200. The measurements or sensing may also be triggered autonomously by the sensor arrangement 200 itself.

The system shown in FIG. 11 may operate completely autonomously after being installed in the battery cell 100. However, for instance a temperature measurement may not be as accurate as possible since a sudden change of a temperature of the electrode stack 120 needs to increase the temperature of the sensor arrangement 200 or parts of it to be sensed by the sensor 240. Yet, such a system may be implemented having a small footprint due to the possibility of highly integrating the necessary circuitry.

To improve the accuracy of a temperature measurement or a measurement of another operational parameter, an external sensor may be used, which can be implemented as a second package (not shown in FIG. 11). The temperature may, for instance be sensed directly inside or in direct contact with the electrolyte. Once again the sensors for both an internal and an external sensor, a temperature sensor, a chemistry sensor, a gas pressure sensor, a stress sensor, a current sensor, an optical sensor or another sensor may be used.

A sensor arrangement 200 according to an embodiment as described above comprises a transmitter 210 to be arranged inside a battery cell 100 and to transmit a signal based on at least one sensed operational parameter of the battery cell 100 wirelessly. Optionally, in such a sensor arrangement, the transmitter 210 may be configured to transmit the signal by a radio-based transmission. Additionally or alternatively, in a sensor arrangement 200 according to an embodiment, the at least one operational parameter of the battery cell may be indicative of a safety-critical condition of the battery cell. Additionally or alternatively, in a sensor arrangement 200 according to an embodiment, the at least one operational parameter of the battery cell may comprise a parameter of a group of parameters, the group of parameters comprising a temperature of the battery cell, a temperature of an electrolyte or an electrolyte solution, a pressure inside the battery cell, a concentration of a chemical element or chemical compound inside the battery cell, a mechanical stress of a housing of the battery cell, a mechanical stress of a component of the battery cell, a current value of a current flowing at least one of inside, out of and into the battery cell, a potential of an electrode of the battery cell and a voltage of the battery cell.

Additionally or alternatively, a sensor arrangement 200 according to an embodiment may comprise a semiconductor die 220, the semiconductor die 220 comprising at least a part of a circuitry of the sensor arrangement, wherein the die is mounted and electrically coupled to a substrate. Optionally, in such a sensor arrangement 200 according to an embodiment, the die 220 may be mounted to the substrate 230 using a flip chip-technique. Further optionally, in a sensor arrangement 200 according to an embodiment, with respect to an electrolyte or an electrolyte solution of the battery cell 100, a chemically inert underfill material may be arranged between the die 220 and the substrate 230.

Additionally or alternatively, in a sensor arrangement 200 according to an embodiment, the die 220 may be at least partially encapsulated by at least one of a mold compound, a resin and an epoxy resin. Additionally or alternatively, in a sensor arrangement 200 according to an embodiment, the die 220 or a package 250 may comprise the die being at least partially covered by, with respect to an electrolyte or an electrolyte solution of the battery cell, a chemically inert protective cover. Optionally, in such a sensor arrangement 200 according to an embodiment, the protective cover may comprise at least one of carbon layer, perylene and polytetrafluoroethylene.

Additionally or alternatively, a sensor arrangement 200 according to an embodiment may further comprise at least one sensor 240 to sense at least one of the at least one operational parameters inside the battery cell 100. Additionally or alternatively, in a sensor arrangement 200 according to an embodiment, the transmitter 210 may comprise an antenna 290 and a transmission signal generator 280 coupled to the antenna 290, wherein at least one sensor 240 of the at least one sensors 240 and the transmission signal generator 280 is integrated into a single package 250.

Additionally or alternatively, in a sensor arrangement 200 according to an embodiment, the transmitter 210 may comprise an antenna 290 and a transmission signal generator 280 coupled to the antenna 290, wherein at least the transmission signal generator 280 is integrated into a first package 250-1 and wherein at least the one sensor 240 of the at least one sensors 240 is integrated into a second package 250-2.

Additionally or alternatively, in a sensor arrangement 200 according to an embodiment, the sensor arrangement 200 may be configured to be coupled to at least one electrode of the battery cell to supply the sensor arrangement with energy to operate. Additionally or alternatively, a sensor arrangement 200 according to an embodiment may further comprise a battery cell 310 to supply the sensor arrangement 200 with energy to operate.

Additionally or alternatively, in a sensor arrangement 200 according to an embodiment, the battery cell 100 is a lithium ion battery cell. Additionally or alternatively, in a sensor arrangement 200 according to an embodiment, the battery cell 100 comprises at least one of an aprotic solvent and lithium hexafluorophosphate. Additionally or alternatively, in a sensor arrangement 200 according to an embodiment, the sensor arrangement 200 may be arranged inside the battery cell 100.

An energy system 330 according to an embodiment comprises a plurality of battery cells 100, the battery cells 100 comprising a sensor arrangement 200, each of the sensor arrangements 200 comprises a transmitter 210 arranged inside the battery cell 100 and configured to transmit a signal based on at least one sensed operational parameter of the battery cell 100 wirelessly. The energy system 330 further comprises a battery management system 340 arranged outside of the plurality of battery cells 100 and configured to receive the signals from the sensor arrangements 200 of the plurality of battery cells 100.

A method for providing a signal of an operational parameter of a battery cell 100 according to an embodiment comprises sensing at least one operational parameter of the battery cell 100 inside the battery cell 100, and transmitting the signal based on the at least one operational parameter of the battery cell 100 from inside the battery cell 100 wirelessly.

To improve the previously-mentioned trade-off between simplifying monitoring a battery cell, its lifespan, its fabrication, and its implementation into, for instance, more complex systems such as a battery, an energy system or the like, apart from transmitting the previously-described operational parameters wirelessly, for instance by radio, in the following a further approach will be described in more detail. The approach described below may optionally be combined with embodiments described above.

To improve the trade-off, in the following embodiments of a sensor arrangement, a battery cell, and an energy system will be described, in which a sensor arrangement comprises a substrate and at least one sensor as well as a control circuit, which are mounted on the substrate. Hence, in the embodiments described below, the at least one sensor as well as the control circuit are mounted on the same or identical substrate. The at least one sensor and the control circuit are located on the substrate in such a way that the at least one sensor is mountable inside a corresponding battery cell, while the control circuit is mountable outside the battery cell.

As described earlier on, the battery cells may be any kind of battery cells, such as lithium-ion based battery cells, but may also be based on other, for instance, more sensitive battery cell technologies and corresponding systems. Lithium-ion based batteries often comprise a comparably small controller circuit which is directly attached to the outside of a housing of the corresponding battery or battery cell. The controller circuit is directly coupled to the battery or battery cell and allows measuring the voltage and, eventually, the current to evaluation the charging state of the corresponding battery or battery cell. Based on the determined charging state of the battery or battery cell, the electronics may then decide as to whether the battery or battery cell is to be charged further or if the charging is to be terminated automatically. Similarly, by monitoring the corresponding operational parameters of the battery or battery cell, during discharging the battery or battery cell a depth discharge may be eventually prevented. The circuit may also include a temperature sensor, which attempts to determine the temperature inside of the battery cell from outside the housing of the battery or battery cell.

Figure 12:
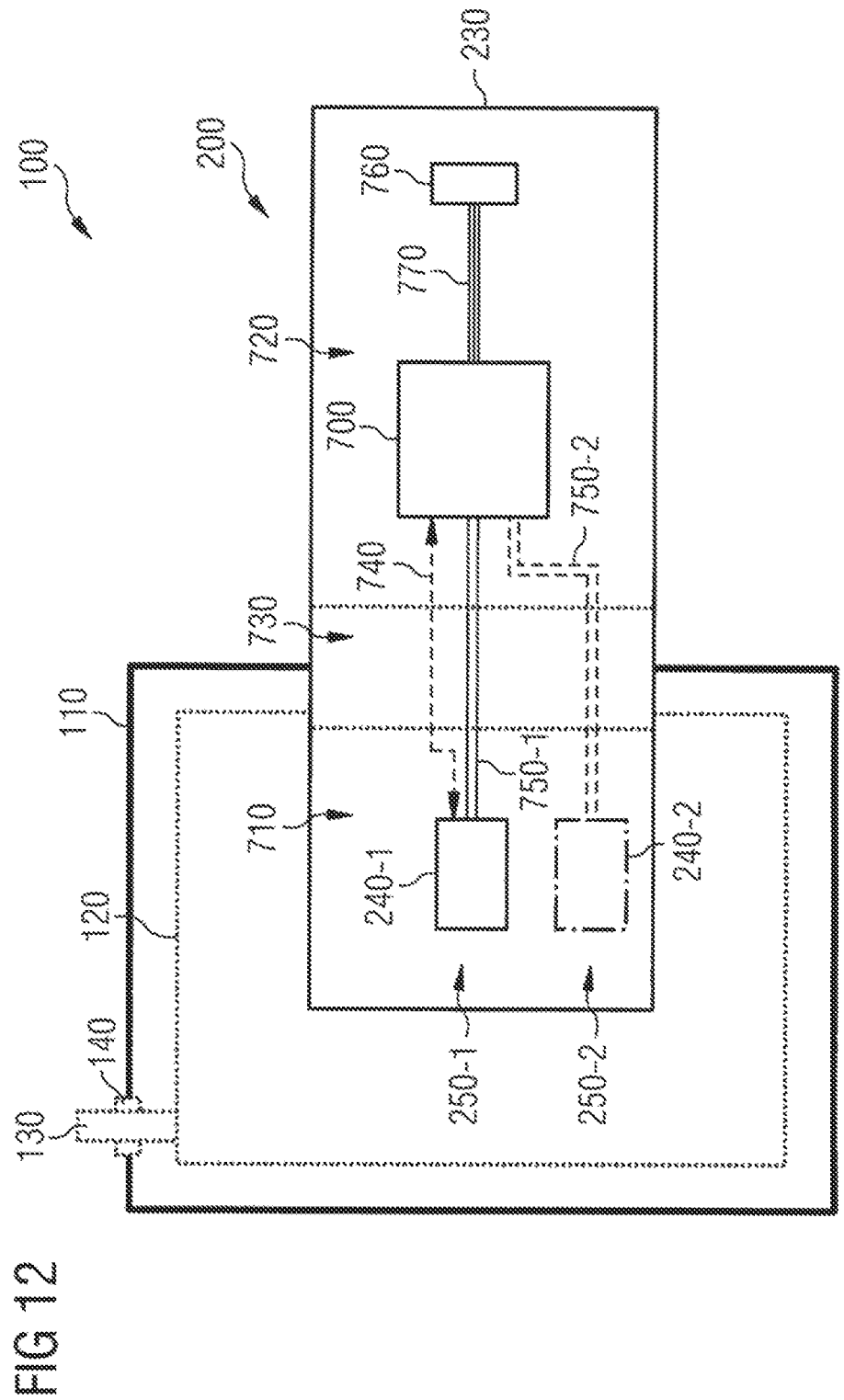
FIG. 12 shows a block diagram of a battery cell according to an embodiment comprising a sensor arrangement according to an embodiment.

FIG. 12 shows a block diagram of a battery cell 100 comprising a housing 110 and a sensor arrangement 200, which will be described in more detail below. The battery cell 110 comprises a stack 120 of electrode materials including, for instance, a cathode material and an anode material along with an optional separator arranged in between the cathode and anode materials. The stack 120 may further comprise one or more corresponding active materials such as an active cathode material, an active anode material or other materials used, for instance, in context with the separator. Examples have been described before.

The battery cell further comprises at least one electrode 130, which is coupled to the corresponding electrodes of the stack 120. By an insulator 140 the electrode 130 is electrically insulated or decoupled from the housing 110 of the battery cell 100.

In FIG. 12, for the sake of simplicity only, a single electrode 130 is shown. The battery cell 100 may comprise more than just one electrode 130, which may be coupled to the other electrode material of the stack 120, to which the electrode 130 shown in FIG. 12 is not coupled. If, however, a battery cell 100 with a single electrode 130 is used, the housing 110 may be used as a further electrode coupled to the other electrode material of the stack 120 to which the electrode 130 shown in FIG. 12 is not coupled.

The sensor arrangement 200 comprises a substrate 230 on which at least one sensor 240 and a control circuit 700 is mounted. In other words, the at least one sensor 240 as well as the control circuit 700 are mounted on the same, identical substrate 230. However, the at least one sensor 240 and the control circuit 700 are located on the substrate 230 in such a way that the at least one sensor 240 is mountable or arrangeable inside the battery cell 100, while the control circuit 700 is mountable or arrangeable outside of the battery cell 100.

The one or more sensors 240 as well as the control circuit 700 may, for instance, be mounted on the same side of a substrate 230. The substrate 230 may in principle be any suitable carrier, such as a more rigid circuit board, such as a printed circuit board (PCB), or a flexible circuit board (FCB). The substrate 230 may, however, be a single structural element, even in the case that the substrate 230 is not a single circuit board or a single flexible circuit board. By using a single structural element, it may be possible to simplify fabricating the sensor arrangement 200.

In other words, the one or more sensors 240 as well as the control circuit 700 may be mounted on the same main surface of the substrate 230. For instance, the substrate 230 may comprise one main surface forming an essentially flat surface. Typically, an extension of the substrate 230 along two linearly independent directions is significantly larger than along a third linearly independent direction. For instance, the first two mentioned directions may be referred to as length and width, while the third mentioned direction may be referred to as thickness. In other words, the thickness may be substantially smaller than the length and the width of the substrate 230. For instance, the thickness may be smaller than a factor of 5, smaller than a factor of 10 or even smaller than a factor of 20 than the corresponding length and width.

In the example depicted in FIG. 12, the sensor arrangement 200 comprises two sensors 240-1, 240-2, which are all arranged inside the battery cell 100 or—in other words—outside of the battery cell 100. However, it is to be noted that the second sensor 240-2 depicted in FIG. 12 represents merely an option, which is by far not necessary to implement. Moreover, the total number of sensors 240 arranged inside the battery cell 100 may also be larger than two. Hence, the sensor arrangement may comprise a plurality of sensors 240 located to be arrangeable or mountable inside the battery cell, if not already mounted in this way.

In other examples, the sensor arrangement 200 and, hence, the battery cell 100 may comprise further sensors arranged outside of the housing 110, which may also be coupled the control circuit 700. However, in the example depicted here, all sensors 240 of the battery cell 100 are arranged inside the battery cell 100 or—in other words— inside the housing 110 of the battery cell 100. As outlined before, the sensors 240 may be configured to sense an operational parameter, for instance, a temperature of the battery cell 100, a temperature of an electrolyte or an electrolyte solution comprised in the housing 110 of the battery cell 100, a pressure inside the battery cell 100, a concentration of a chemical element or a chemical compound inside the battery cell 100, a mechanical stress of the housing 110 of the battery cell 100, a mechanical stress of another component of the battery cell 100, a current value of a current flowing at least one of inside, out of and into the battery cell 100, a potential of an electrode 130 of the battery cell 100, for instance, with respect to a reference potential, a voltage of the battery cell 100 measured between the electrodes 130 or the corresponding electrode materials of the stack 120, or any combination of these parameters.

The control circuit 700 may then during operation process the sensed operational parameter. For instance, the control circuit 700 may verify during operation as to if the sensed parameter falls within a range according to the safety or operational specifications of the battery cell 100, but may also perform more complex computations. For instance, based on more than one sensed operational parameter a status value may be calculated and checked against one or more rules. The control circuit 700 may evaluate a rate of change of one or more of the sensed operational parameters based on a history of the operational parameters sensed by the at least one sensor 240 and evaluate, based on the determined rate of change, the current situation of the battery cell 100. For instance, by processing the temperature of the battery cell, the pressure inside the battery cell 100 or other safety-related parameters, a dangerous operational condition may eventually be detectable at an earlier stage. The control circuit 700 may in such a case be configured to or—in other words—, during operation, initiate a corresponding counter measure. Among the counter measures disconnecting or initiating a corresponding disconnection of the battery cell 100 from the rest of the system may be one counter measure. Similarly, the control circuit 700 may cause the rest of the system to draw less current from the battery cell 100 or to provide less current to the battery cell 100.

While the sensor 240 or the plurality of sensors 240 is arranged inside of the battery cell 100 and, hence, inside of the housing 110, the control circuit 700 is arranged outside of the battery cell 100 and, consequently, outside of the housing 110.

In the example depicted in FIG. 12 this is achieved by arranging the sensors 240 inside a first area 710 of the substrate 230, while the control circuit 700 is arranged in a second area 720 of the substrate 230. The first area 710 is completely arranged inside of the housing 110, while the second area 720 of the substrate 230 is arranged completely outside of the housing 110. Here, a sealing area 730 is arranged in between the first and second areas 710, 720. The sealing area 730 is therefore located in such a way to allow the housing 110 of the battery cell 100 to seal the inside of the battery cell 100 from the outside of the battery cell 100. In other words, a path 740 exists on a surface of the substrate 230 between the at least one sensor 240 and the control circuit 700, which interconnects the at least one sensor 240 and the control circuit 700, along which the sealing area 730 is located. Due to the location of the sensors 240 inside the first area 710 and the control circuit 700 in the second area, the path 740 interconnects the first and second areas 710, 720 by passing the sealing area 730. In yet other words, the sealing area 730 is located along the path 740 on the surface of the substrate 230 between the at least one sensor 240 and the control circuit 700.

The housing 110 as well as the sealing area 730 are designed and configured in such a way that an electrolyte comprised inside of the housing 110 is sufficiently well prevented from leaving the housing 110 to allow a safe and reliable operation of the battery cell 100. For instance, the substrate 230 may be laminated between components of the housing 110 in the case of a soft case battery cell, which is also referred to as a pouch cell, or may be mounted to a corresponding component of the housing 110 in the case of a hard case battery cell. Examples will be described below in more detail with respect to FIGS. 13 and 14.

To allow during manufacturing of the battery cell 100 the housing 110 to be sealed at the sealing area 730, the sensors 240 may be located at a distance of at least 2 mm from the control circuit 700. However, depending on the design parameters as well as other parameters, also larger lower boundaries of the distance between the at least one sensor 240 and the control circuit 700 may be suitable. For instance, the distance between the at least one sensor 240 and the control circuit 700 may also be at least 5 mm or at least 10 mm.

In the example depicted in FIG. 12, the substrate 230 is configured and designed to electrically couple the at least one sensor 240 to the control circuit 700. For instance, the substrate may comprise at least one patterned electrically conductive layer, which forms one or more conductive lines 750-1, 750-2 to couple the two sensors 240-1, 240-2 depicted in FIG. 12 to the control circuit 700.

Depending on the complexity of the conductive lines 750 required to couple the one or more sensors 240 to the control circuit 700, a multilayer substrate 230 comprising a plurality of corresponding electrically conductive layers forming the conductive lines 750 may be used. However, to simplify fabrication, the substrate 230 may comprise a single patterned electrically conductive layer forming the one or more conductive lines 750. For example, the plurality of conductive lines 750 may provide exclusively the electrical coupling between the one or more sensors 240 and the control circuit 700. For instance, in the case of a single conductive line 750 electrically coupling a sensor 240 to the control circuit, a buried conductive layer may be used to close the electric circuit. To such a buried conductive layer more than one sensor 240 may be coupled. In this case, the buried conductive layer may be coupled to a reference potential such as ground potential, to name just one example.

As indicated earlier and described in more detail before, inside of the housing 110 an electrolyte or an electrolyte solution may be present. For instance, in the case of a lithium-ion battery cell 100, the battery cell 100 may comprise at least one of an aprotic solvent and lithium hexafluorophosphate. In case the substrate 230 comprises a patterned electrically conductive top layer, which forms at least partially the surface of the substrate 230, the conductive top layer may be chemically inert with respect to the electrolyte material used or to be used inside the battery cell 100, when the battery cell 100 is operated. In other words, the material of the conductive lines 750 may be chosen to be not chemically reactive to or to show a comparably slow chemical reaction speed with respect to the electrolyte in view of an expected lifetime of the battery cell 100.

For instance, the conductive line 750 may comprise a suitable material composition, a stacked design, comprise a protective layer or any combination thereof. To name just some examples, a multiplayer of copper (Cu) forming the actual conductive line 750, nickel (Ni) on top of the copper, and gold (Au) on top of the nickel may be used. Due to gold being arranged outside of the nickel and copper, such a material composition used for the conductive lines 750 may be comparably resistant with respect to chemical attacks from the electrolyte. In other examples, an additional layer of palladium (Pd) may be arranged between the nickel layer and the gold layer. Also using pure gold conductive lines may be a suitable way to implement the substrate 230. However, the conductive lines 750 may equally well be covered by a protective layer which may, for instance, be removed during mounting the one or more sensors 240. For instance, such a protective layer may be susceptible to heat or mechanical vibrations used during mounting or bonding the sensors 240 onto the substrate 230.

The sensors 240 may be integrated sensors, which are fabricated on a semiconducting or insulating die. In this case, the die of the sensor 240 may be mounted to the substrate 230 using a flip chip-technique. As described before, with respect to an electrolyte or an electrolyte solution of the battery cell 100, a chemically inert under-fill material may used between the die and the substrate 230 to protect the electrical contacts of the sensor 240 from being attacked by the electrolyte or electrolyte solution. Additionally, the die may be at least partially or fully encapsulated by a mold component, a resin, an epoxy resin or any combination thereof.

The sensors 240 may equally well be implemented as packages 250 comprising the die at least partially covered by a chemically inert protective cover with respect to the electrolyte or the electrolyte solution of the battery cell 100. Corresponding materials for the protective cover may, for instance, be based on a carbon layer, perylene and polytetrafluoroethylene (PTFE) to name just a few examples.

To electrically couple the control circuit 700 to components such as a battery management system or the like, the sensor arrangement 200 may further comprise a connecter 760. The connecter 760 may be mounted on the substrate 230 and located in such a way that it is located or mountable outside the battery cell 100. Here the connecter 760 is also located in the second area 720. For example, the connecter 760 may also be located on the same side or the same surface of the substrate 230 as, for instance, the control circuit 700 and/or the one or more of the sensors 240.

Similar to electrically coupling the one or more sensors 240 to the control circuit 700, also the connecter 760 may be electrically coupled to the control circuit 700. Similar to the previously-described conduction line 750, the substrate 230 may once again be configured to electrically couple the connecter 760 to the control circuit 700 by using a single or at least one patterned electrically conductive layer forming one or more further conductive lines 770. For the sake of simplicity only, in FIG. 12 the conductive lines 750-1 and 750-2 each comprise two individual conductive lines coupling the two sensors 240-1, 240-2 to the control circuit 700. In other embodiments, a different number of conductive lines 750 may be used to electrically couple the sensors 240 to the control circuit 700. Similarly, in FIG. 12 three further conductive lines 770 are shown to electrically couple the control circuit 700 to the connecter 760. However, in other embodiments, different numbers of further conductive lines 770 may be used. For instance, the number of further conductive lines 770 may be smaller or even larger than the number of lines shown in FIG. 12. Once again, the buried common conductive layer may be used, when implemented.

Depending on the application in mind, the control circuit 700 may, for instance, be part of a battery management system (BMS), a battery cell management system or the like. The control circuit 700 may be an integrated circuit (IC) arranged inside a package. For instance, the control circuit 700 may be formed completely or at least partially in or on a semiconductor die.

A sensor arrangement 200 according to an embodiment may, for instance, be used as a sensor package, which may be arranged on a substrate 230 comprising electrical circuits. For instance, a thin flexible circuit board may be used as the substrate 230. The substrate 230 may further comprise a controller circuit or control circuit 700 and, at the same time, at least one sensor 240 to monitor, for instance, a temperature, a pressure, the presence of gas or a chemical composition of a gas to name just a few examples. In the examples and embodiments described, the part of the substrate 230 comprising the control circuit 700 is arranged outside of the battery cell, while the part comprising the sensors 240 is inside of the battery cell 100.

Figure 14:
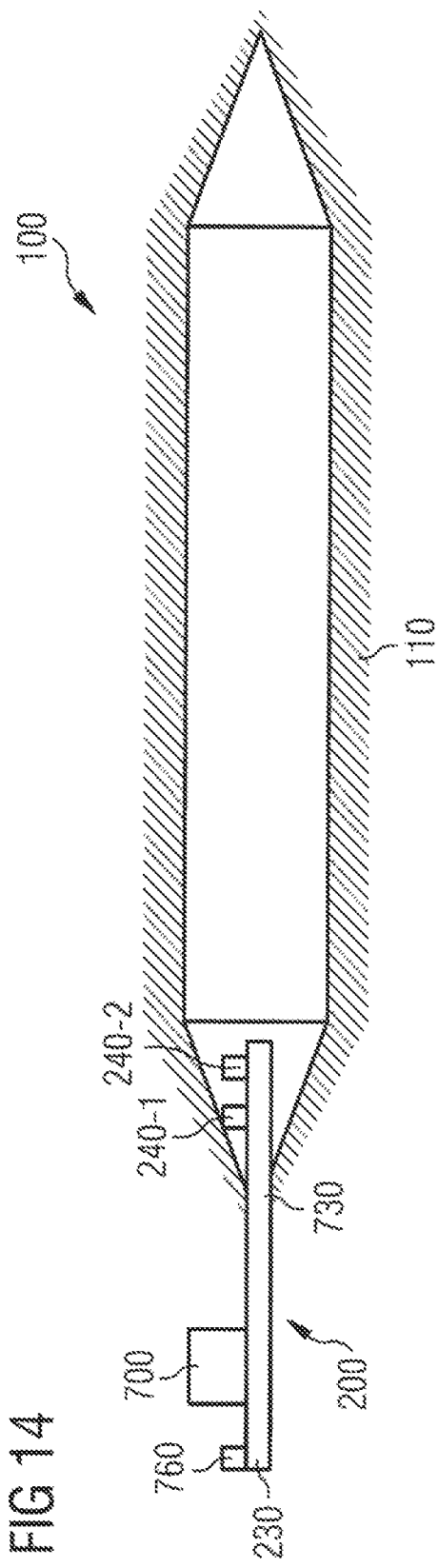
FIG. 14 shows a block diagram of further a battery cell according to an embodiment comprising a sensor arrangement according to an embodiment.

To allow this, the sealing area 730, with respect to which the housing 110 of the battery may be sufficiently well sealed. For instance, in the case of a soft case battery cell or pouch cell, the housing 110 sealed with respect to the substrate 230 may be sealed by heat-sealing. An example is shown in FIG. 14.

In a sensor arrangement 200, or a battery cell 100 according to an embodiment, both the sensor system including the sensors 240 as well as the "intelligence" of the sensor arrangement in the form of the control circuit 700 are located on the same substrate 230 such as the same circuit board. However, the battery cell encloses the substrate 230 only partially, and a part of the substrate 230, such as the second area 720, is arranged outside of the housing 110. This may allow the one or more sensors 240 to directly determine and measure the operational parameters of the battery cell 100, where the most critical chemical, thermal or other processes occur, while the evaluation circuit or control circuit 700 can easily be coupled to and connected from the outside of the battery cell 100 or its housing 100. The control circuit 700 may be arranged outside of the housing 110 as in a conventional design.

Figure 13:
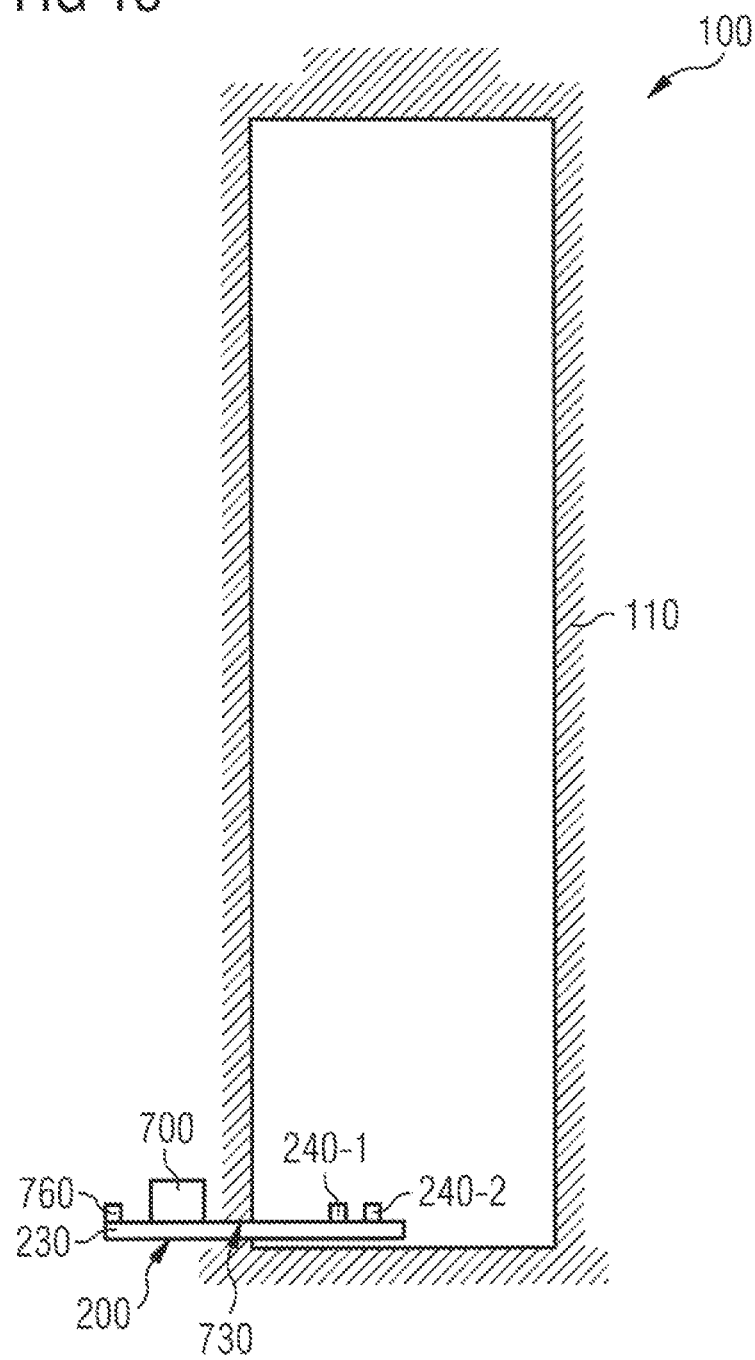
FIG. 13 shows a block diagram of further a battery cell according to an embodiment comprising a sensor arrangement according to an embodiment.

FIG. 13 shows a schematic block diagram as a cross-sectional view of a further battery cell 100 in the form of a hard case battery cell. The housing 110 of the battery cell 100 depicted in FIG. 13 may, for instance, be a cylindrical hard case comprising a feedthrough through the material of the housing 110. For instance, the housing may be fabricated from a metallic material.

The battery cell 100 further comprises a sensor arrangement 200, which may comprise a flex print circuit board as the substrate 230. On the main surface of the substrate 230, the connecter 760, the control circuit 700 implemented as a battery management system-controller, as well as a pressure sensor 240-1 and a temperature sensor 240-2 may be arranged.

The feedthrough through the housing 110 is sealed with respect to the substrate 230 in the sealing area 730 of the substrate 230. For instance, by an appropriate compound, mold or resin, the inside of the battery cell 100 and, hence, the inside of the housing 110 may be sealed to prevent the electrolyte or electrolyte solution from the inside of the housing 110 to leave the housing 110. Similarly, air or other gases and materials may be prevented from reaching the inside of the housing 110 by the same sealing.

FIG. 14 shows a further embodiment of a battery cell 100 which is implemented here as a soft case battery cell or a pouch cell. Again, the battery cell 100 comprises a housing 110, which may, for instance, be based on films, foils or other sheets, which may be laminated to form a sealed volume, inside which one or more sensors 240 may be arranged.

The battery cell 100 comprises a sensor arrangement 200 comprising a substrate 230 on which a pressure sensor 240-1 and a temperature sensor 240-2 are arranged. As previously described, the sensors 240-1, 240-2 are arranged inside of the housing 110 of the battery cell 100. To allow the battery cell 100 to be sealed and to prevent the electrolyte and other materials from leaving the housing 110, the substrate 230 is fed through the housing 110 by inserting the substrate 230 into the housing 110 at a welding seam such that the housing 110 is sealed off at the sealing area 730 of the substrate 230. Once again, in the example depicted in FIG. 14, the substrate 230 may be a flex print circuit board comprising apart from the two sensors 240 mentioned, a connecter 760 as well as a control circuit 700, which may once again act as a battery management system controller.

Embodiments, therefore, comprise a system with a circuit board comprising controller circuits in the form of the control circuit 700 outside the battery package or battery cell 100 on one side and integrated sensors or other sensors 200, which are located inside the battery package or battery cell on a different side of the substrate 230.

Figure 15:
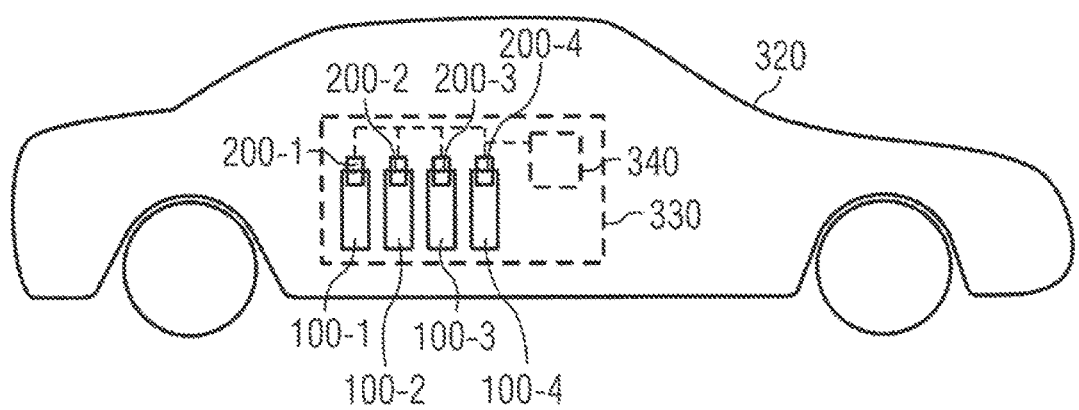
FIG. 15 shows a schematic diagram of vehicle comprising an energy system according to an embodiment.

FIG. 15 shows a schematic diagram of an application of one or more battery cells 100. Here a plurality of battery cells 100-1, . . . , 100-4 form a part of an energy system 330, implemented as a part of a vehicle 320. The vehicle 320 may, for instance, be a car, a truck, an agricultural machine, a locomotive, a construction machine or any other motorized vehicle. However, an energy system 330 may equally well be used in the framework of a non-motorized vehicle. For instance, the vehicle 320 may be an electric vehicle or a hybrid vehicle as described before.

Although in FIG. 15 the energy system 330 is shown to comprise four battery cells 100, the number of battery cells may equally well be higher or lower. However, each of the battery cells 100 comprises a sensor arrangement 200-1, . . . , 200-4 as described before. Depending on the implementation, the control circuits 700 (not shown in FIG. 15) of the sensor arrangements 200 may control each of the battery cells 100 individually. The control circuits 700 may in this case form battery cell management systems, which may prevent the individual cells 100 from being overcharged, depth-discharged or assuming a condition outside of the safety specifications.

However, the control circuits 700 of the sensor arrangements 200 may equally well be coupled to a battery management system 340 so that the control circuits 700 form a part of the battery management system 340 of the energy system 330.

By using a sensor arrangement 200 according to an embodiment, for instance as an integrated battery sensor controller for the battery cells 100, an energy system 330 or the like, it may be possible to improve the previously-mentioned trade-off between simplifying monitoring a battery cell, its safety, its lifespan, its fabrication and its implementation.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks performing a certain function shall be understood as functional blocks comprising circuitry that is adapted for performing or to perform a certain function, respectively. Hence, such a block may as well be understood as a circuitry, element or the like being adapted to, configured to or suited for a specific operation. A block being adapted for performing a certain operation does not imply that such an operation is performed at a given time instant.

The methods described herein may be implemented as software, for instance, as a computer program. The sub-processes may be performed by such a program by, for instance, writing into a memory location. Similarly, reading or receiving data may be performed by reading from the same or another memory location. A memory location may be a register or another memory of an appropriate hardware. The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple sub-processes. Such sub-processes may be included and part of the disclosure of this single processes unless explicitly excluded.

What is claimed is:

1. A sensor arrangement comprising:
   a substrate; and
   at least one sensor and a control circuit mounted on the substrate,
   wherein the at least one sensor is located inside a housing of a battery cell and the control circuit is located outside the housing of the battery cell,
   wherein the substrate comprises a sealing area that is located such as to allow the housing of the battery cell to seal the inside of the battery cell from the outside of the battery cell, and the sealing area is located along a path on a surface the substrate between the at least one sensor and the control circuit.

2. The sensor arrangement according to claim 1, wherein the at least one sensor is located at a distance of at least 2 millimeters from the control circuit.

3. The sensor arrangement according to claim 1, wherein the at least one sensor and the control circuit are mounted on the same side of the substrate.

4. The sensor arrangement according to claim 1, wherein the substrate is configured to electrically couple the at least one sensor to the control circuit.

5. The sensor arrangement according to claim 4, wherein the substrate comprises a single or at least one patterned electrically conductive layer forming at least one conductive line to electrically couple the at least one sensor to the control circuit.

6. The sensor arrangement according to claim 4, wherein the substrate comprises a patterned electrically conductive top layer forming at least partially a surface of the substrate, wherein the top layer is chemically inert with respect to an electrolyte material to be used inside the battery cell, when the battery cell is operated.

7. The sensor arrangement according to claim 1, wherein a connector is mounted on the substrate to be mountable outside the battery cell.

8. The sensor arrangement according to claim 7, wherein the substrate is configured to electrically couple the connector to the control circuit.

9. The sensor arrangement according to claim 7, wherein the substrate comprises a single or at least one patterned electrically conductive layer forming a plurality of further conductive lines to electrically couple the connector to the control circuit.

10. The sensor arrangement according to claim 1, wherein the substrate is a single structural element.

11. The sensor arrangement according to claim 1, wherein the substrate is a circuit board or a flexible circuit board.

12. The sensor arrangement according to claim 1, wherein the at least one sensor comprises a plurality of sensors mounted on the substrate to be mountable inside the battery cell.

13. The sensor arrangement according to claim 1, wherein the at least one sensor is configured to sense at least one operational parameter of the battery cell, and wherein the control circuit is configured to process the sensed operational parameter.

14. The sensor arrangement according to claim 1, wherein the control circuit is at least one of a part of a battery management system, a battery cell management system and an integrated circuit.

15. A battery cell comprising:
    a housing; and
    a sensor arrangement comprising a substrate, at least one sensor and a control circuit, wherein the at least one sensor and the control circuit are mounted on the substrate such that the at least one sensor is located inside the battery cell and the control circuit is located outside the battery cell, and the substrate comprises a sealing area that is located such as to allow the housing of the battery cell to seal the inside of the battery cell from the outside of the battery cell, and the sealing T area is located along a path on a surface of the substrate between the at least one sensor and the control circuit.

16. The battery cell according to claim 15, wherein the battery cell is a hard case battery cell or a soft case battery cell.

17. An energy system comprising:
    a plurality of battery cells, each battery cell comprising a housing, and a sensor arrangement, each sensor arrangement comprising a substrate, at least one sensor and a control circuit, wherein the at least one sensor and the control circuit are mounted on the substrate such that the at least one sensor is located inside the battery cell and the control circuit is located outside the battery cell,
    wherein each of the substrates comprises a sealing area that is located such as to allow the housing of the respective battery cell to seal the inside of the battery cell from the outside of the battery cell, and the sealing area is located along a path on a surface of the substrate between the at least one sensor and the control circuit.

18. The energy system according to claim 17, wherein the control circuits of the plurality of battery cells each form a battery cell management system, and are coupled to form a battery management system.

* * * * *